(12) United States Patent
Loo

(10) Patent No.: US 6,191,483 B1
(45) Date of Patent: Feb. 20, 2001

(54) PACKAGE STRUCTURE FOR LOW COST AND ULTRA THIN CHIP SCALE PACKAGE

(75) Inventor: Mike C. Loo, San Jose, CA (US)

(73) Assignee: Philips Electronics North America Corporation, New York, NY (US)

( * ) Notice: Under 35 U.S.C. 154(b), the term of this patent shall be extended for 0 days.

(21) Appl. No.: 09/306,517

(22) Filed: May 6, 1999

(51) Int. Cl.[7] .................................................. H01L 23/48
(52) U.S. Cl. ......................... 257/737; 257/778; 257/780
(58) Field of Search .................................. 257/737, 778, 257/738, 780

(56) References Cited

U.S. PATENT DOCUMENTS

| | | | |
|---|---|---|---|
| 5,936,304 | * | 5/2000 | Lii et al. ............................. 257/778 |
| 5,990,545 | * | 11/1999 | Schueller et al. .................... 257/778 |
| 6,064,114 | * | 5/2000 | Higgins et al. ...................... 257/778 |

* cited by examiner

*Primary Examiner*—Roy Potter
(74) *Attorney, Agent, or Firm*—Patrick T. King

(57) ABSTRACT

Thin organic layers are laminated on both the top and bottom of a relatively thin ceramic layer to form a reliable thinner composite substrate for packaging a chip-scale flip-chip die in a thin package. A semiconductor die has a number of solder bump-mounting pads formed thereupon which are connected with solder bumps to mounting pads on the top surface of the thin composite substrate.

6 Claims, 2 Drawing Sheets

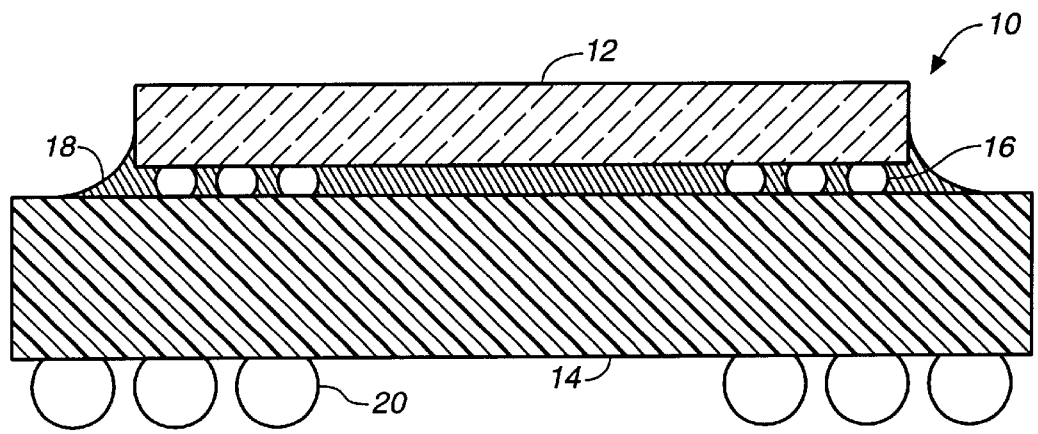
FIG._1
*(PRIOR ART)*
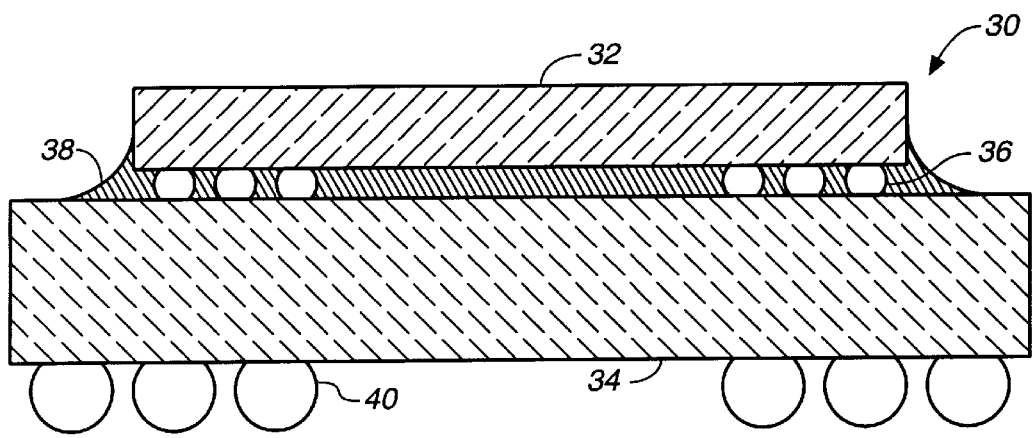
FIG._2
*(PRIOR ART)*

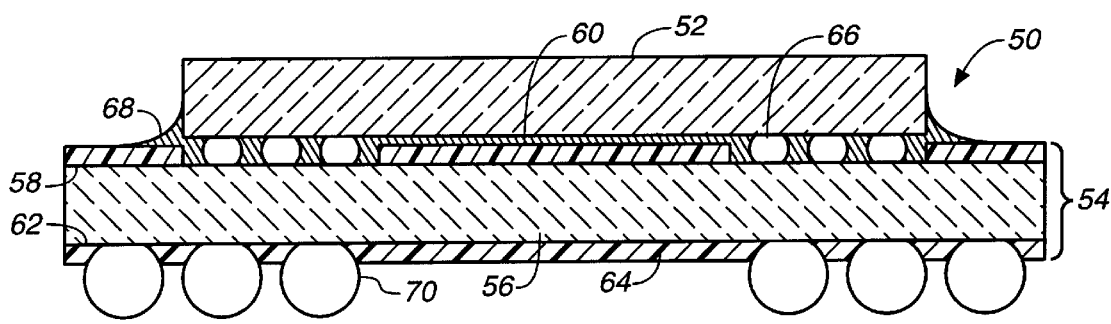
FIG._3
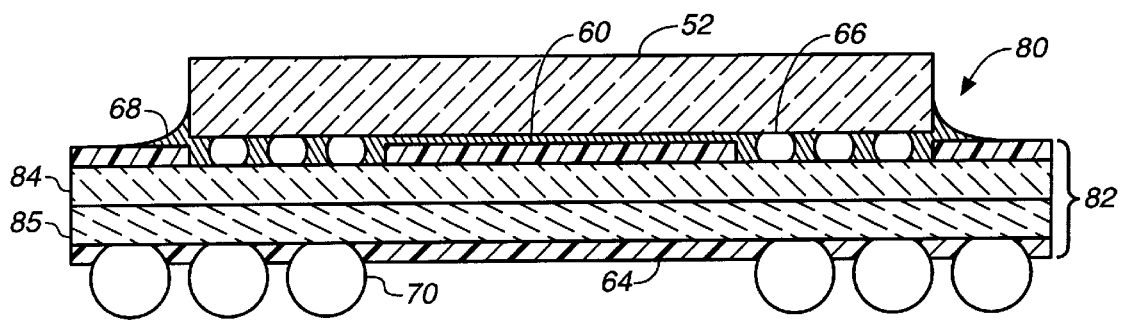
FIG._4
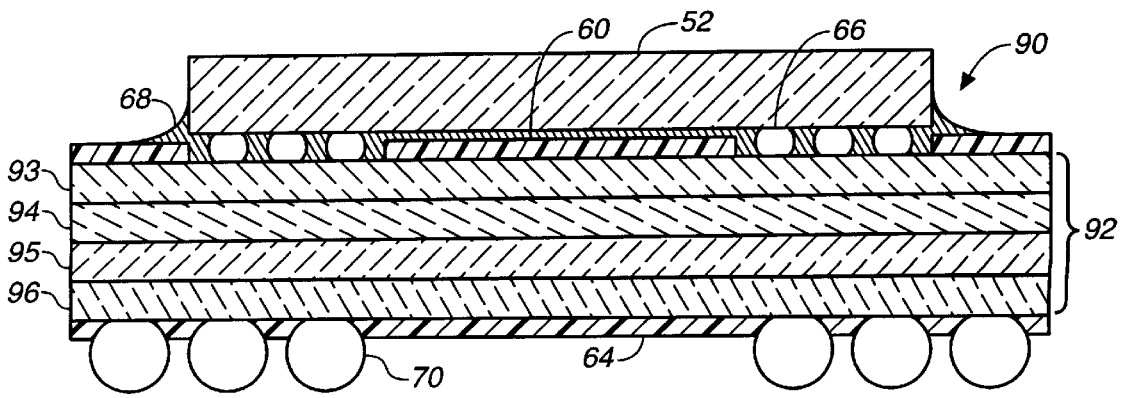
FIG._5

PACKAGE STRUCTURE FOR LOW COST AND ULTRA THIN CHIP SCALE PACKAGE

BACKGROUND OF THE INVENTION

1. Field of the Invention

This invention relates to packaging for integrated circuits and, more particularly, to chip-scale packaging.

2. Prior Art

While many packaging schemes for integrated-circuit use packages which are much larger in volume than an integrated-circuit die, chip-scale packaging techniques provide integrated-circuit packages which are closer in size, or scale, to the integrated-circuit die. Some current chip-scale packaging techniques use a relatively thick laminated substrate, such as an epoxy board, or else a polyimide film substrate and fix the integrated-circuit die to the substrate using flip-chip, leadless packages to attach the integrated-circuit die to the substrate with solder bumps For flip-chip, chip-scale packages with either laminated substrates or with polyimide substrates, it is expensive to provide high-density conductors on such substrates.

Flip-chip, chip-scale packages with either laminated substrates have reliability problems because of the mismatch between the thermal coefficients of expansion (TCE) of an organic substrate (17 ppm/° C.) and a silicon die (7 ppm/° C.). The differences in TCEs within current chip-scale, flip-chip packages cause reliability problems due to cracking of the solder bump connections between the integrated-circuit chips and the organic substrates. Currently, an underfill layer of epoxy material can be located in the space between the lower part of the flip-chip die and the upper surface of the laminated organic substrate in an attempt to improve solder joint reliability, but underfill itself can cause die cracking and delamination.

For a flip-chip, chip-scale package with a conventional one-or-two layer ceramic substrate, it is relatively inexpensive to provide densely packed conductors. The ceramic material has a TCE of 7 ppm/° C. and the reliability of a flip-chip package with a ceramic substrate is well established. However, because of the brittleness of the ceramic substrate material, the thickness of the ceramic substrate has to be at least 0.65 mm to prevent the substrate from cracking during handling. A ceramic substrate for a flip-chip package therefore has to be on the order of 0.65 mm thick. This results in the thickness of the overall ceramic, flip-chip package being much greater than is desired for miniature applications.

Although the area of a chip scale package is quite small, the reliability of chip-scale packages is still questionable due to the thermal expansion mismatch between the substrate (7 ppm/° C.) and the organic board (17 ppm/° C.).

Currently, no low-cost, very small form factor chip scale package is available in industry.

FIG. 1 illustrates a typical prior art chip-scale package 10 configuration. A silicon flip-chip die 12 is mounted to the top surface of a laminated organic substrate 14, such as an epoxy circuit board. A number of solder bumps, typically shown as 16, are heated to form solder bonds between respective solder-bump mounting pads on the surface of the flip-chip die 12 and on the top surface of the thick organic laminated substrate 14. The thick organic laminated epoxy substrate 14 typically has a thickness of 1.0 mm. An underfill layer 18 of epoxy material is located in the space between the lower part of the flip-chip die 12 and the upper surface of the laminated organic substrate 14. The underfill layer 18 is formed with a layer of liquid epoxy material which is drawn into the space between the die and the substrate by capillary action and cured. The underfill layer 18 reinforces the solder bump 14 to help prevent failure of the solder joints caused by the differences between the TCEs of the die 12 and the organic substrate 14.

To attach the package 10 to a mounting surface, a number of solder balls, typically shown as 20, are heated to provide respective connections between solder ball mounting pads on the bottom surface of the organic laminated substrate 14 and solder ball mounting pads on the mounting surface of, for example, a printed circuit board.

As mentioned previously, it is expensive to provide a high-density set of conductors on a laminated epoxy substrates.

FIG. 2 shows another typical prior art chip-scale package 30 configuration. This configuration is similar to that of FIG. 1. except for the use of a more inexpensive but still relatively thick ceramic substrate. A silicon flip-chip die 32 is mounted to the top surface of a ceramic substrate 34. Solder bumps, typically shown as 36, are heated to form solder bonds between respective solder-bump mounting pads on the surface of the flipchip die 32 and on the top surface of the thick ceramic substrate 34, which typically has a thickness of at least 0.65 mm. An underfill layer 38 of epoxy material is located in the space between the lower part of the flip-chip die 32 and the upper surface of the ceramic substrate 34 and is also formed with a layer of liquid epoxy material being drawn into the space between the die 32 and the substrate 34 by capillary action and cured. The underfill layer 38 similarly reinforces the solder bump 34 joints to prevent failure of the solder joints by cracking caused by the differences in temperature between the die 32 and the substrate 34.

The package 30 is attached to a mounting surface with a number of solder balls, typically shown as 40, which are heated to provide respective connections between solder ball mounting pads on the bottom surface of the ceramic substrate 34 and solder ball mounting pads on the mounting surface of, for example, a printed circuit board.

As mentioned previously, for a conventional one-or-two layer ceramic substrate, it is relatively inexpensive to provide densely packed conductors for a flip-chip chip-scale package. The reliability of a flip-chip package with a thick ceramic substrate is also well established. However, a ceramic substrate is relatively brittle and the thickness of the substrate has to be at least 0.65 mm to prevent the substrate from cracking during handling. This results in the overall thickness of the ceramic, flip-chip package being much greater than is desired.

Consequently a need exists for a low-cost, chip-scale ceramic package which can use a ceramic substrate with a very small form factor but still provide good reliability.

SUMMARY OF THE INVENTION

It is therefore an object of the invention to provide a low cost chip-scale ceramic package with a very small form factor.

The present invention provides for forming or laminating a thin organic layer on both the top and bottom of a relatively thin ceramic substrate to form a reliable thin composite substrate having a thickness in the range of 0.025 to 0.050 mm. Flip-chip technology is used to connect a flip-chip die to the thin composite substrate.

The composite structure of the substrate allows the relatively thinner ceramic substrate to be protected by the thin organic layers to prevent formation of micro cracks so that early cracking during handling does not occur. The present invention allows a thinner ceramic substrate, having a thickness in the range of 0.2 mm, to be used so that an overall package thickness of 1.0 mm or less is achieved.

Because the thermal expansion coefficient of the two organic layers usually is much higher than that of an aluminum oxide ceramic (7 ppm/° C.), the thin organic layers on the top and bottom of the ceramic substrate results in the overall thermal expansion coefficient of the composite substrate to be higher than 7 ppm/° C. to obtain a higher level of reliability when the improved thinner ceramic package is attached to the mounting surface of an organic circuit board or the like.

The invention provides an improved package structure and packaging method for a thinner chip-scale integrated-circuit package which has a temperature coefficient of expansion which is better suited for mounting to a printed circuit board than a conventional ceramic substrate. The package structure includes a semiconductor die having a top surface and a bottom surface with a number of solder bump-mounting pads formed thereupon. A composite chip-scale substrate is provided for mounting the semiconductor die thereto. The composite chip-scale substrate includes a relatively thin ceramic layer with a top surface and a bottom surface. The relatively thin ceramic substrate has a temperature coefficient of expansion (TCE). A number of solder-bump mounting pads are formed on the top surface of the thin ceramic layer and a number of solder-ball mounting pads are formed on the bottom surface of the thin ceramic layer. A number of conductors are also deposited on the top surface and on the bottom surface of the ceramic layer and connected to respective solder-bump and solder-ball mounting pads on these surfaces.

To form the composite ceramic substrate, a first relatively thin organic film is deposited on the top surface of the ceramic layer except for the solder-bump mounting pads and a second relatively thin organic film is deposited on the bottom surface of the ceramic layer except for the solder ball mounting pads. These first and the second organic films each have a temperature coefficient of expansion (TCE) which is greater than that of the ceramic material. The temperature coefficient of expansion of the composite chip-scale substrate has a temperature coefficient of expansion which is greater than that of the ceramic layer but less than that of the organic material. The temperature coefficient of expansion of the composite chip-scale substrate is therefore more compatible with the greater temperature coefficient of expansion of an organic printed circuit board.

A number of solder bumps are provided for connecting the solder bump-mounting pads on the bottom surface of the semiconductor die to the solder-bump mounting pads on the top surface of the ceramic layer. A number of solder balls are also provided which are adapted for connecting the solder ball-mounting pads on the bottom surface of the ceramic layer to solder-ball mounting pads on a mounting surface of the printed circuit board.

In other preferred embodiments of the invention, the composite ceramic substrate is formed as two or more layers of ceramic material with conductors formed on the surfaces of the various ceramic layers and with vias formed in the ceramic layers for interconnection of the conductors. A single composite ceramic substrate typically has a thickness in the range of 0.2 mm and the first and second relatively thin organic films have thicknesses in the range of 0.025–0.075 mm.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a cross sectional view of a prior art chip scale package which uses a flip-chip on a thick organic laminated substrate.

FIG. 2 is a cross sectional view of a prior art chip scale package which uses a flip-chip on a thick ceramic substrate.

FIG. 3 is a cross sectional view of a chip scale package according to the invention which uses a thin composite substrate which has two thin organic layers deposited on the top and bottom surfaces of a relatively thinner ceramic layer.

FIG. 4 is a cross sectional view of a chip scale package according to the invention which uses a thin composite substrate formed with thin organic layers deposited on both the top and bottom surfaces of two ceramic layers.

FIG. 5 is a cross sectional view of a chip scale package according to the invention which uses a multi-layer composite substrate formed with thin organic layers deposited on the top and bottom surfaces of four ceramic layers.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 3 shows a chip-scale flip-chip package 50 according to the invention. A silicon flip-chip die 52 is mounted to the top surface of a relatively thin composite substrate 54. The composite substrate 54 uses a relatively thin ceramic layer 56. The material of the ceramic layer is, for Ad example, aluminum oxide. The ceramic layer 56 typically has a thickness of 0.2 mm., which is considerably thinner than the 0.65 mm thickness of a prior-art ceramic substrate. A top surface 58 of the thin ceramic layer 56 has deposited or laminated thereupon a first thin organic epoxy layer 60. A bottom surface 62 of the thin ceramic layer 56 also has deposited or laminated thereupon a second thin organic epoxy layer 64. The first and second thin epoxy layers have thickness on the order of 0.025–0.075 mm. The composite substrate 54 has a TCE which is between that of each of the organic layers (17 ppm/° C.) and that of the ceramic layers (7 ppm/° C.) and which is closer to the TCE of an epoxy printed circuit board to which the package is mounted.

A number of conductors (not shown) are formed on the top surface 58 and the bottom surface 62 of the thin ceramic layer 56. Convention techniques are used to provide connections, such as conductive vias or the like, through the ceramic layer between the top and bottom conductors. The conductors are connected to respective solder-bump mounting pads formed on the top surface of the thin ceramic layer and on the bottom surface of the thin ceramic layer. The conductors are economically formed on the ceramic layer by appropriate firing in a high temperature furnace. The solder-bump mounting pads are exposed through corresponding openings in the first thin organic epoxy layers 60 and the solder-ball mounting pads are exposed through corresponding openings in the first thin organic epoxy layers 60

Solder bumps, typically shown as 66, are heated to form solder bonds between respective solder-bump mounting pads on the bottom surface of the flip-chip die 52 and on the top surface of the thin ceramic layer 56.

An underfill layer 68 of epoxy material is subsequently located in the space between the lower part of the flip-chip die 52 and the upper surface of the composite substrate 54. The underfill layer 68 is formed with a layer of liquid epoxy material being drawn by capillary action into the space between the die 52 and the composite substrate 56 and cured. The underfill layer 68 also reinforces the solder bump 66 joints to prevent failure of the solder joints by cracking.

The package 50 is attached to a mounting surface with a number of solder balls, typically shown as 70, which are heated to provide respective connections between solder ball mounting pads on the bottom surface of the thin ceramic layer 56 and corresponding solder ball mounting pads on the mounting surface (not shown) of, for example, an organic epoxy printed circuit board.

The thin organic layers 60, 64, each with a thickness, for example, in the range of 0.025 to 0.050 mm, are laminated on the top and bottom surfaces of the relatively thin ceramic layer 56, which has a thickness of 0.2 mm. This provides a reliable composite substrate 54 with a thickness in the range of approximately one-half of the thickness of a convention ceramic substrate. The TCE of the composite substrate is also more compatible with an organic epoxy printed-circuit board on which the package is mounted. Flip chip technology connects the flip-chip die 52 to the composite substrate 54 to provide a low profile, chip-scale package.

With the thin organic layer on top and bottom, the substrate 54 is formed of a composite material with improved TCE and physical characteristics in comparison to a conventional thicker ceramic substrate. The thin ceramic layer 56 of the composite substrate is protected by the coatings 60, 64 to prevent formation of micro cracks to prevent cracking during handling. Thus, a thinner composite substrate in the range of 0.25 mm can be used to achieve an overall package thickness of 1.0 mm or less.

The thermal coefficient of expansion (TCE) of the thin organic layers 60, 64 (17 ppm/C) is much greater than the TCE of the aluminum oxide ceramic layer 56 (7 ppm/° C.). By applying the thin organic layers on the top and bottom surface of the thin ceramic layer 56, the overall thermal expansion coefficient of the composite substrate is greater than 7 ppm/° C. so that the reliability of the package when mounted to a circuit board level reliability is much improved.

FIG. 4 shows one alternative embodiment of a chip-scale flip-chip packages 80 according to the invention. In this embodiment, a two-layer ceramic substrate 82, corresponding to the substrate 56 of FIG. 3, is formed with two thinner ceramic layers 84, 85 to provide additional conductors and interconnections as required for particular applications. The overall thickness of the two-layer substrate 82 is similar to the single-layer of ceramic 56 or FIG. 3. The chip-scale package 80 is otherwise constructed the same fashion as the package 50 of FIG. 3 with the exception that the ceramic layer is formed of two sublayers 84, 85.

FIG. 5 shows another alternative embodiment of a chip-scale flip-chip packages 80 according to the invention. In this embodiment, a multi-layered, for example, a four-layer, ceramic substrate 92 is formed with four thinner ceramic layers 93, 94, 95, 96 to provide additional conductors and interconnections for particular applications. The overall thickness of the four-layer substrate 92 is shown to be greater than the single-layer of ceramic 56 or FIG. 3. The chip-scale package 90 is otherwise constructed to be very similar to the package 50 of FIG. 3.

The foregoing descriptions of specific embodiments of the present invention have been presented for purposes of illustration and description. they are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A thin chip-scale integrated-chip package, comprising:
   a semiconductor die having a top surface and a bottom surface, wherein the bottom surface has a number of solder ball-mounting pads formed thereupon;
   a composite chip-scale substrate to which is mounted the semiconductor die, the composite chip-scale substrate including:
   a thin aluminum oxide layer having a top surface and a bottom surface, wherein the aluminum oxide layer has a thickness approximately 0.2 mm,
   wherein a number of solder-bump connection pads are formed on the top surface of the aluminum oxide, wherein a number of solder-ball connection pads are formed on the bottom surface of the thin aluminum oxide layer, wherein a number of conductors are deposited on the top surface and on the bottom surface of the thin aluminum oxide layer and connected to respective solder-bump connection pads and solder-ball connection pads;
   a first thin organic film deposited on the top surface of the aluminum oxide layer except for the solder-bump connection pads; and
   a second thin organic film deposited on the bottom surface of the aluminum oxide layer except for the solder-ball connection pads;
   wherein the first and second relatively thin organic films have a thickness in the range of 0.025–0.075 mm;
   a number of solder bumps adapted for connecting the solder-bump connection pads on the bottom surface of the semiconductor die to the solder-bump mounting pads on the top surface of the aluminum oxide layer; and
   a number of solder balls adapted for connecting the solder ball-mounting pads on the bottom surface of the ceramic layer to corresponding solder-ball mounting pads on a mounting surface of a printed circuit board.

2. The chip-scale package of claim 1 where the first and the second organic films each have a temperature coefficient of expansion greater than the temperature coefficient of expansion of the aluminum oxide layer.

3. The chip-scale package of claim 1 including a layer of epoxy deposited between the lower surface of the die and the top surface of the composite chip-scale substrate.

4. A composite substrate for mounting an integrated-circuit die in a chip-scale package, comprising:
   a thin aluminum oxide layer having a top surface, a bottom surface, and a thickness in the range of 0.025–0.075 mm, wherein the lateral area of the aluminum oxide layer is somewhat greater than the lateral area of the integrated-circuit die and wherein a number of solder-bump mounting pads are formed on the top surface of the aluminum oxide layer, wherein a number of solder-ball mounting pads are formed on the bottom surface of the aluminum oxide layer, and wherein a number of conductors are deposited on the top surface and on the bottom surface of the aluminum oxide substrate and connected to respective solder-bump and solder-ball mounting pads;

a first thin organic film having a thickness in the range of 0.025–0.075 mm and deposited on the top surface of the aluminum oxide layer except for the solder-bump mounting pads;

a second thin organic film having a thickness in the range of 0.025–0.075 mm and deposited on the bottom surface of the aluminum oxide layer except for the solder-ball mounting pads; and where the first and the second organic films each have a temperature coefficient of expansion (TCE) greater than the temperature coefficient of expansion of the aluminum oxide layer.

5. The composite substrate of claim 4 wherein the composite substrate is two or more aluminum oxide layers with conductors formed on the surfaces of the aluminum oxide layers and with vias formed in the aluminum oxide layers for interconnection of the conductors.

6. The chip-scale package of claim 1 wherein the composite chip-scale substrate includes two or more layers of aluminum oxide material with conductors formed on the surfaces of the layers and with vias formed in the layers for interconnection of the conductors.

* * * * *